United States Patent [19]

Tsang et al.

[11] Patent Number: 5,353,246
[45] Date of Patent: Oct. 4, 1994

[54] PROGRAMMABLE SEMICONDUCTOR ANTIFUSE STRUCTURE AND METHOD OF FABRICATING

[75] Inventors: Wai M. Tsang, Beaverton, Oreg.; Daniel C. Hu, Los Altos Hills, Calif.; Dong T. Khong, Singapore, Singapore

[73] Assignee: Lattice Semiconductor Corporation, Hillsboro, Oreg.

[21] Appl. No.: 108,363

[22] Filed: Aug. 18, 1993

Related U.S. Application Data

[62] Division of Ser. No. 781,056, Oct. 18, 1991, Pat. No. 5,272,666.

[51] Int. Cl.$^5$ ............... H01L 29/10; H01L 21/283
[52] U.S. Cl. ........................ 365/96; 257/530; 437/922; 437/52; 437/192; 437/200
[58] Field of Search ........ 365/96; 257/530, 2; 437/922, 50, 52, 192, 200

[56] References Cited

U.S. PATENT DOCUMENTS

| | | | |
|---|---|---|---|
| 4,377,856 | 3/1983 | Roesner | 365/154 |
| 4,424,579 | 1/1984 | Roesner | 365/105 |
| 4,442,507 | 4/1984 | Roesner | 365/100 |
| 4,569,120 | 2/1986 | Stacy et al. | 29/574 |
| 4,569,121 | 2/1986 | Lim et al. | 29/574 |
| 4,748,490 | 5/1988 | Hollingsworth | 357/51 |
| 4,758,745 | 7/1988 | Elgamal et al. | 307/465 |
| 4,796,074 | 1/1989 | Roesner | 357/51 |
| 4,914,055 | 4/1990 | Gordon et al. | 437/192 |
| 5,095,362 | 3/1992 | Roesner | 357/23.4 |
| 5,166,901 | 11/1992 | Shaw et al. | 365/105 |
| 5,171,715 | 12/1992 | Husher et al. | 437/52 |
| 5,248,632 | 9/1993 | Tung et al. | 437/922 |
| 5,272,666 | 12/1993 | Tsang et al. | 365/96 |

OTHER PUBLICATIONS

Vinod Malhotra, John E. Mahan, and Daniel L. Ellsworth, "An Electro-thermal Model Of Memory Switching In Vertical Polycrystalline Silicon Structures", *IEEE Transactions On Electron Devices* vol. 35, No. 9, Sep. 1988, pp. 1514–1523.

Yosi Shacham-Diamand, Alex Sinar, Eric Sirkin, Ilan Blech, and Levy Gerzberg, "IPEL-A Novel Ion-Implanted Electrically Programmable Element", *IEEE Electron Device Letters* vol. 10, No. 5, May 1989, pp. 180–182.

Vinod Malhotra, John E. Mahan, and Daniel L. Ellsworth, "Fundamentals Of Memory Switching In Vertical Polycrystalline Silicon Structures", *IEEE Transactions On Electron Devices* vol. ED-32, No. 11, Nov. 1985, pp. 2441–2449.

Noriaki Sato, Takahiro Nawata, and Kunihiko Wada, "A New Programmable Cell Utilizing Insulator Breakdown", IC Development Division, Fujitsu Limited Nakahara-ku, Kawasaki 211, Japan, 1985 pp. 639–642.

*Primary Examiner*—Viet Q. Nguyen
*Attorney, Agent, or Firm*—Skjerven, Morrill, MacPherson, Franklin & Friel

[57] ABSTRACT

A programmable semiconductor antifuse structure and method of fabricating are provided which allow for miniaturization of components to an area of less than one micron. The cell exhibits a high pre-programmed resistance of more than $1 \times 10^7$ ohms and has an extremely low programmed cell resistance of around 50 ohms.

4 Claims, 3 Drawing Sheets

PROGRAMMABLE SEMICONDUCTOR ANTIFUSE STRUCTURE AND METHOD OF FABRICATING

This application is a division of application Ser. No. 07/781,056, filed Oct. 18, 1991 now U.S. Pat. No. 5,272,666.

FIELD OF THE INVENTION

The present invention relates to the field of electrically erasable programmable read-only memories (EEPROMs) and, in particular, a method of fabricating a "write once" read-only memory cell.

BACKGROUND OF THE INVENTION

Miniaturization of semiconductor circuits is generally achieved by either decreasing the size of the semiconductor chip assigned to each memory cell and/or increasing the size of the chip. Because a substantial loss and yield occurs as the chip area increases, miniaturization of semiconductor circuits using this process has typically been too complex and uneconomical to pursue. Therefore, substantial efforts have been made in the integrated circuit industry to reduce the size of the individual circuit components within a given area.

For example, U.S. Pat. No. 4,796,074 discloses a method of fabricating a high density mass programmable read-only memory. The read-only memory is comprised of a plurality of memory cells. Each cell comprises a Schottky diode which is configured vertically with an antifuse structure. The inclusion of a Schottky diode, which is prevalent in many prior art structures, increases the total cell size. Moreover, it has been noted that a Schottky diode as part of the antifuse vertical structure has an inherent reliability problem because of the resulting barrier between the metallization layer and the lightly doped semiconductor layer. See, for example, U.S. Pat. No. 4,569,121, issued to Lim et al., col. 6, 43-63.

Therefore, a need arises for a method of manufacturing a programmable semiconductor antifuse structure without an associated structure, such as a Schottky diode, and having an area of less than one micron.

SUMMARY OF THE INVENTION

A method of fabricating and structure for a programmable semiconductor antifuse structure are provided. The antifuse structure provides a low-resistance ohmic contact between two conductive structures in a memory cell without additional circuity, such as a Schottky diode. As a result, this structure achieves a desirable geometry of less than one micron.

The antifuse memory cell structure comprises a semiconductor substrate, a first insulating layer formed on the substrate, and a first conductive structure disposed on the first insulating layer. A second insulating layer is formed on this conductive structure. An aperture in the second insulating layer exposes a portion of the first conductive structure in which a second conductive structure is formed. A second semiconductor structure is then formed over the second conductive structure and a portion of the second insulating layer to form the antifuse. This semiconductor structure has a high resistivity during its unprogrammed state and a low resistivity during its programmed state. A third conductive structure covering the second semiconductor structure completes the antifuse memory cell.

In another embodiment, a diffusion region is formed in a semiconductor substrate with insulating regions positioned on either side of the diffusion region. A semiconductor structure (described above as the second semiconductor structure) is formed over the diffusion region and a portion of the insulating regions. A conductive structure covering the semiconductor structure completes this embodiment of the antifuse memory cell.

DETAILED DESCRIPTION

Figure 1:
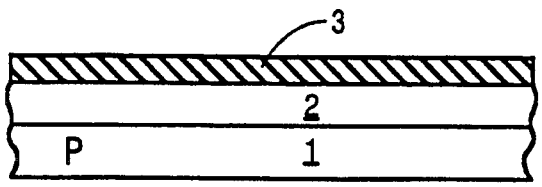
FIG. 1 illustrates a silicon substrate doped to a particular resistivity upon which an oxide layer is thermally grown, and a polysilicon layer is deposited.

The fabrication process to obtain an antifuse structure in accordance with the present invention is shown in FIGS. 1–10. The process begins, as shown in FIG. 1, with a P-type silicon substrate 1 which is doped to a resistivity between 14 and 24 ohm-cm. An oxide layer 2 is thermally grown on substrate 1 to a thickness of 200–6000 Å to ensure satisfactory insulation of subsequent conductive structures from substrate 1. In one embodiment, oxide layer 2 is grown to 5000 Å.

After oxide layer 2 is formed, polysilicon layer 3 is deposited to a thickness of 3500–4500 Å by a conventional LPCVD process. Polysilicon layer 3 is then doped with phosphorus oxychloride (POCl$_3$) at 900° C. to achieve 15–21 ohm/sq. This doping ensures polysilicon layer 3 acts as a regular ohmic contact, serving as a word line in one embodiment. During doping, a thin oxide may form on the exposed wafer surface. A deposition-created oxide may be unetchable, thereby causing incomplete etching in subsequent masking processes.

Figure 2:
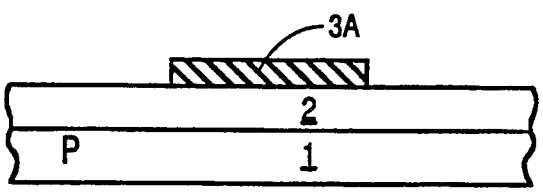
FIG. 2 shows the structure of FIG. 1 subsequent to an etching of the polysilicon layer.

Therefore, at this point, this oxide is removed by a process called deglazing which includes emersion of the structure in a dilute hydrofluoric solution, followed by a water rinse and a drying step. In one embodiment of the present invention, deglazing is accomplished with a 10% hydrofluoric solution for approximately one minute. However, emersion of the structure for more than one minute will not damage the structure. A photoresist mask, not shown, is then placed over polysilicon layer 3 and an etch is performed, thereby resulting in the polysilicon structure 3A which is shown in FIG. 2. Polysilicon structure 3A serves, in one embodiment, as a word line for the memory cell.

Figure 3:
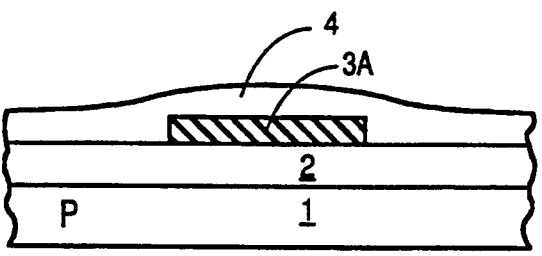
FIG. 3 shows the structure of FIG. 2 upon which a boron phosphorous silicon glass (BPSG) layer is deposited.

In the next step, as seen in FIG. 3, an insulating layer 4 of Borophosphosilicate glass (BPSG) is deposited over the polysilicon structure 3A using a conventional LPCVD process. The deposited thickness of the BPSG is in the range of 5000–8000 Å, and the percentage composition is 3–4% boron and 4–5% phosphorous. The purpose of BPSG layer 4 is to insulate polysilicon structure 3A from adjacent cells which may also include conductive structures. A rapid thermal annealing is then performed at approximately 1040° C. in either nitrogen, oxygen, or steam. The concentration of boron and phosphorus present in the BPSG causes the glass to flow during this annealing step, thereby creating a more planer surface. Note that the use of BPSG is not critical to the invention. A phosphorous doped glass may also be used in this step to cause glass flow.

Figure 4:
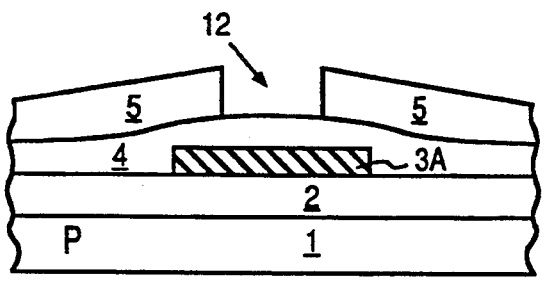
FIG. 4 shows the structure of FIG. 3 in which a photoresist mask is deposited and selectively exposed to utraviolet light, thereby forming an antifuse opening.
Figure 5:
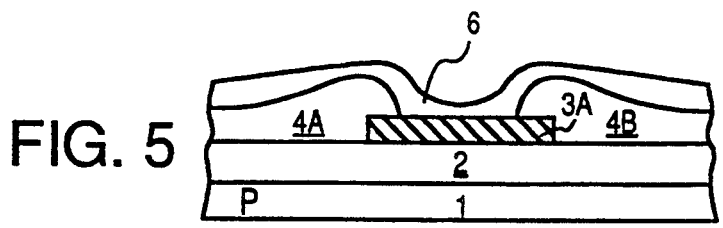
FIG. 5 illustrates the structure of FIG. 4 subsequent to a step in which the BPSG layer is flowed and a titanium layer is deposited over the resulting structure.

Referring to FIG. 4, a conventional photo-resist mask 5 is then deposited and selectively exposed to UV light to form antifuse opening 12. A subsequent anisotropic etch by, for example, plasma-etching extends opening 12 to the surface of polysilicon structure 3A, thereby forming BPSG structures 4A and 4B as shown in FIG. 5. Another rapid thermal annealing step is performed at this point at approximately 1070° C., with either nitrogen, oxygen, or steam, thereby flowing the glass and rounding the edges of BPSG structures 4A and 4B. Rounding the edges of BPSG structures 4A and 4B improves the reliability of the antifuse layer (subsequent layer 9) and other associated conductive layers of the cell by ensuring proper continuity, i.e. no breaks of material along the edges of adjacent layers.

Figure 6:
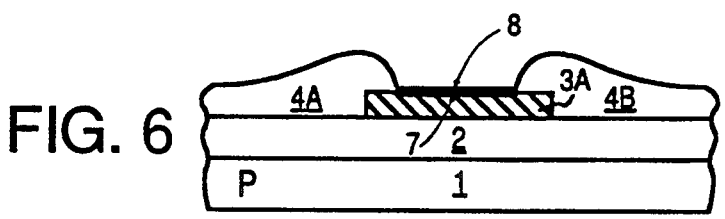
FIG. 6 shows the structure of FIG. 5 in which a layer of titanium silicide and a titanium nitride layer have been formed in the antifuse opening.

A layer of titanium 6 is then sputtered on the cell to a thickness of approximately 750–850 Å. The structure in FIG. 5 is then subjected to another rapid thermal annealing at 650° C. in nitrogen for approximately 60 seconds to form layer 7 (typically less than 1000 Å) of titanium silicide ($TiS_2$) as shown in FIG. 6. Specifically, titanium layer 6 reacts with polysilicon structure 3A to form titanium silicide layer 7 which provides ohmic contact with polysilicon structure 3A. Additionally, a layer of titanium nitride and titanium is formed due to the use of nitrogen during annealing. Unreacted titanium and titanium nitride (TiN) are then stripped with a solution comprising $NH_4OH:H_2O_2:H_2O$ (in a ratio of 1:1:2).

A thin layer 8, i.e. less than 1000 Å, of titanium nitride (TiN) is formed on titanium silicide layer 7 in a rapid thermal annealing step at 850° C. for approximately 60 seconds using ammonia ($NH_3$). The titanium nitride layer 8 is deposited over titanium silicide layer 7 to form a protection for the next layer, the antifuse material. Without titanium nitride layer 8, titanium doping having any impurities could counter dope the antifuse material (to be applied), thereby destroying its uniform high resistivity which is critical to the antifuse structure.

Therefore, titanium nitride layer 8 provides an optimal surface on which to deposit amorphous silicon, the antifuse material used in this invention. Alternatively, platinum silicide could be used instead of titanium nitride to prevent doping of the antifuse.

Figure 7:
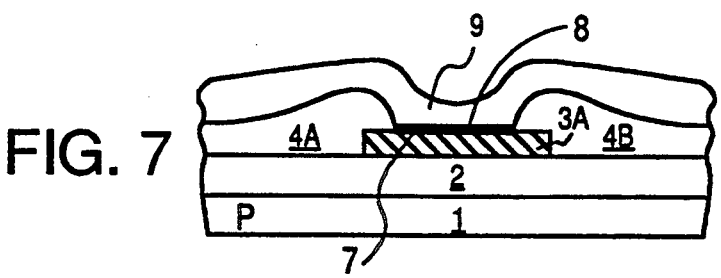
FIG. 7 illustrates the structure of FIG. 6 subsequent to a step which deposits an amorphous silicon layer over the cell.

As shown in FIG. 7 and described briefly above, an amorphous silicon layer 9 is deposited over BPSG structures 4A and 4B, and titanium nitride layer 8 to achieve a predetermined programmed voltage of approximately 10–11 volts (which will be described in detail later). The thicker the layer of amorphous silicon, the greater the threshold voltage required to program the antifuse. Amorphous silicon layer 9 has a thickness of 500–2000 Å and is typically deposited using a low pressure CVD at approximately 580° C. An optional argon implant may be done at this point at an energy of 50–120 KeV. The programming voltage of amorphous silicon layer 9, i.e. the antifuse structure, increases with increasing dosage of argon ions. However, a satisfactory programmed voltage is attainable without this argon implant.

Figure 8:
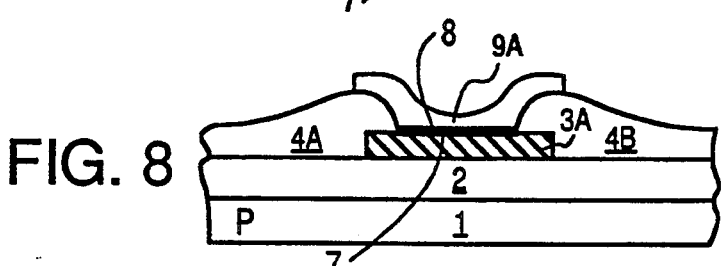
FIG. 8 shows the structure of FIG. 7 in which the amorphous silicon layer has been etched to form the antifuse.
Figure 9:
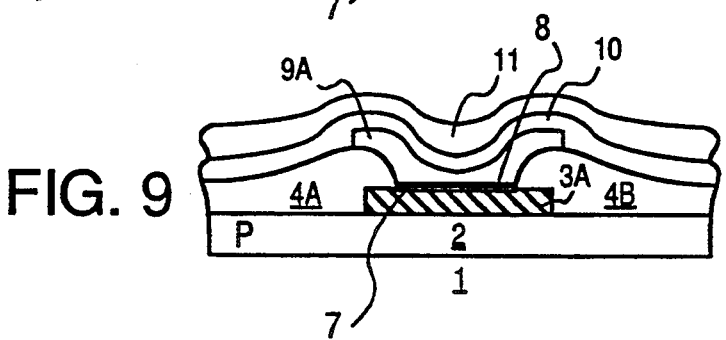
FIG. 9 illustrates the structure of FIG. 8 in which layers of titanium tungsten and aluminum silicon copper have been deposited on the structure.
Figure 10:
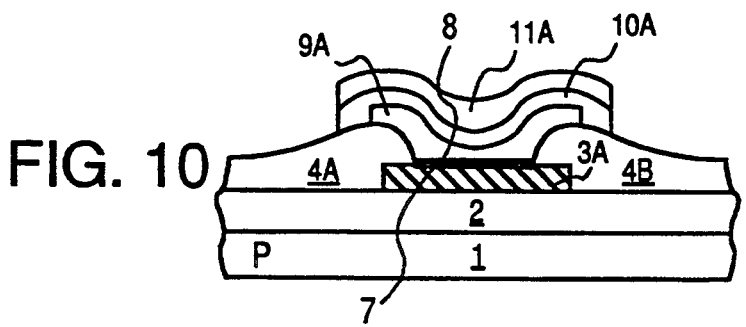
FIG. 10 shows the structure of FIG. 9 in which a final etching step forms the resulting antifuse structure.

A conventional photo-resist mask is then placed over amorphous silicon layer 9 and selectively exposed to U.V. light. A subsequent anisotropic etching step (generally performed by plasma etching) forms the amorphous silicon structure 9A as shown in FIG. 8. Then, as shown in FIG. 9, a barrier layer 10 of titanium tungsten (TiW) is deposited over amorphous silicon structure 9A and BPSG structures 4A and 4B. A typical thickness of TiW layer 10 is between 1000–2000 Å. A metal layer 11, in this embodiment aluminum silicon copper (AlSiCu) is deposited to a thickness of approximately 5000–6000 Å. The TiW layer 10 prevents the conductive metal 11 from diffusing through to amorphous silicon structure 9A. The AlSiCu layer 11 and TiW layer 10, which comprise the metallic contact to the antifuse structure, are then anisotropically etched using a mask (not shown) to form the structure shown in FIG. 10.

In the final steps of this process (not shown), a protective layer, generally referred to as a passivation layer, is formed to protect components on the chip's surface during testing and packaging. In one embodiment of the present invention, passivation deposition is accomplished using undoped PECVD of silicon dioxide composition at a thickness of 5000±500 Å and 7000±700 Å of plasma silicon nitride.

A patterning process removes the passivation layer over the metallization terminal pads on the periphery of the chip. This step is generally known as the pad mask. At this point, the wafer goes through a final heating process (or alloy step), the purpose of which is to ensure all contacts are ohmic and to remove all charges which may have accumulated during the fabrication process. In one embodiment, this alloy step is performed at 400° C. using hydrogen.

Figure 11:
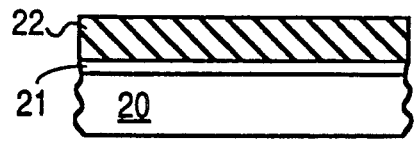
FIG. 11 illustrates another embodiment of the present invention in which an oxide and a silicon nitride layer are formed on a doped silicon substrate.

In another embodiment of the present invention, an active N+ area is used instead of the N+ doped polysilicon described above. The steps in forming this active N+ area are shown in FIGS. 11–14. Referring to FIG. 11, a P-type silicon substrate 20 is doped to a resistivity of 14–24 ohm-cm. An oxide layer 21 is thermally grown on substrate 20 at a thickness of 300–1000 Å. A silicon nitride layer 22 is then deposited on oxide laser 21 to a thickness of 1000–2000 Å using a conventional LPCVD process.

Figure 12:
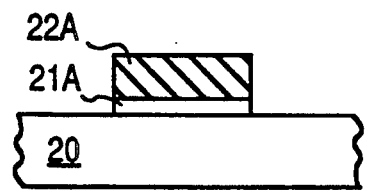
FIG. 12 shows the structure of FIG. 11 subsequent to etching of the oxide and silicon nitride layers.
Figure 13:
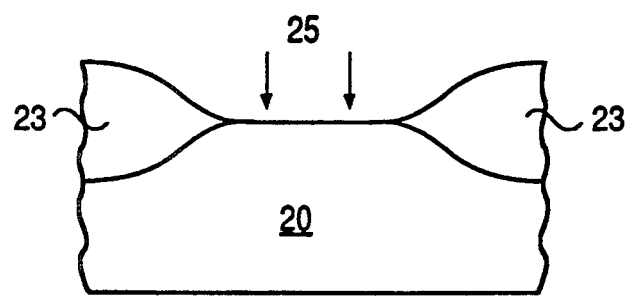
FIG. 13 illustrates the structure of FIG. 12 after field oxidation, an oxide etch, and nitride removal.
Figure 14:
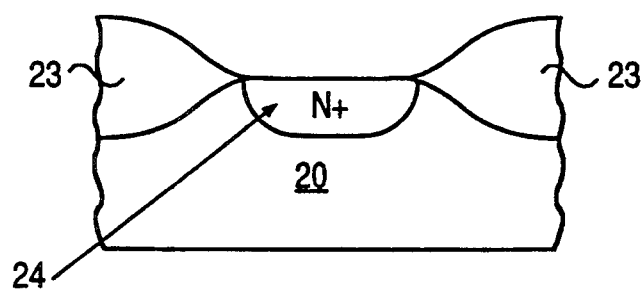
FIG. 14 shows formation of the N+ diffusion channel after an N+ implant.

A photoresist mask (not shown) is placed over silicon nitride layer 22 and an etch is performed, resulting in the structure shown in FIG. 12. An oxidation of this structure is then performed in steam at approximately 1000°–1200° C. to form a layer of silicon dioxide 4000–6000 Å thick. Subsequently, this silicon dioxide layer is etched in a solution of $H_2O:HF$ (10:1) for approximately 60 seconds. At this time, silicon nitride structure 22A and oxide structure 21A are removed using either a plasma etch or hot phosphoric acid. Typically, this removal takes 1–2 hours, and results in silicon dioxide regions 23 shown in FIG. 13. Finally, the structure of FIG. 13 is implanted at an energy of 50–90 KeV with either a phosphorus or an arsenic dose, shown by arrows 25, of $1\times10^{15}$–$1\times10^{16}$ atoms/cm$^2$ to form the N+ diffusion area 24 shown in FIG. 14. Following implantation, the steps described in reference to FIGS. 6–10 are performed. In this manner, an N+ diffusion channel is used in place of the N+-doped polysilicon structure 3A (shown in FIG. 2).

Programming of the above-described antifuse cell is accomplished by applying a threshold voltage to the metallic contact of the cell comprising TiW structure 10A and AlSiCu structure 11A (the bit line in one embodiment). Because of the unique configuration of this antifuse and methodology of forming the same, the threshold voltage is 10–11 volts. Note that during programming, a filamentary conduction region is created that effectively shorts the device. This permits conduction between AlSiCu structure 11A and polysilicon structure 3A (or the N+ diffusion area 24).

An antifuse cell fabricated in accordance with the present invention has the following advantages:

1) The cell exhibits high pre-programmed resistance of more than $1\times10^7$ ohms as measured between AlSiCu structure 11A and polysilicon structure 3A (or the N+ diffusion area 24).

2) The cell has an extremely low programmed resistance of approximately 50 ohms which is twenty times less "on" resistance than disclosed by the prior art.

3) The cell allows reduction of programming time to less than 3 $\mu$sec which is less than 1000 times the programming time per bit of a conventional EEPROM cell.

The preceding description is meant to be illustrative only and not limiting. Those skilled in the art will be able to fabricate other devices in accordance with this invention based on the above description and the appended claims.

We claim:

1. The method of forming an electrical programmable read only memory cell having an antifuse structure comprising the steps of:

growing a first insulating layer on a silicon substrate;

depositing a first semiconductor layer on said first insulating layer;

doping said first semiconductor layer to a predetermined conductivity;

etching said first semiconductor layer;

depositing a second insulating layer over said first semiconductor layer and said first insulating layer;

etching said second insulating layer to form an opening which extends to and exposes a portion of said first semiconductor layer;

forming a conductive layer over said first semiconductor layer;

depositing a second semiconductor layer over said second insulating layer and said conductive layer;

etching said second semiconductor layer, wherein said second semiconductor layer overlies said conductive layer and a portion of said second insulating layer;

depositing a metal layer on said second semiconductor layer; and etching said metal layer to form a contact to said memory cell.

2. A method of claim 1 further comprising:

forming a passivation layer; and removing a portion of said passivation layer on the periphery of said memory cell.

3. The method of claim 2 further comprising:

performing an alloy to ensure all contacts are ohmic.

4. The method of claim 1 wherein said step of forming said conductive layer comprises:

sputtering a layer of titanium;

performing a thermal annealing to form a layer of titanium silicide;

stripping unreacted titanium and titanium nitride; and forming a layer of titanium nitride on said layer of titanium silicide.

* * * * *